US012782457B2

(12) United States Patent
Yu et al.

(10) Patent No.: US 12,782,457 B2
(45) Date of Patent: Nov. 3, 2026

(54) SCREENING METHOD AND DEVICE FOR ECHELON-USE BATTERY

(71) Applicants: GUANGDONG BRUNP RECYCLING TECHNOLOGY CO., LTD., Foshan (CN); HUNAN BRUNP RECYCLING TECHNOLOGY CO., LTD., Changsha (CN); HUNAN BRUNP EV RECYCLING CO., LTD., Changsha (CN)

(72) Inventors: Haijun Yu, Foshan (CN); Kang Chen, Foshan (CN); Aixia Li, Foshan (CN); Yinghao Xie, Foshan (CN); Xuemei Zhang, Foshan (CN); Changdong Li, Foshan (CN)

(73) Assignees: GUANGDONG BRUNP RECYCLING TECHNOLOGY CO., LTD., Foshan (CN); HUNAN BRUNP RECYCLING TECHNOLOGY CO., LTD., Changsha (CN); HUNAN BRUNP EV RECYCLING CO., LTD., Changsha (CN)

( * ) Notice: Subject to any disclaimer, the term of this patent is extended or adjusted under 35 U.S.C. 154(b) by 386 days.

(21) Appl. No.: 18/681,873

(22) PCT Filed: Aug. 15, 2022

(86) PCT No.: PCT/CN2022/112574
§ 371 (c)(1),
(2) Date: Feb. 7, 2024

(87) PCT Pub. No.: WO2023/071421
PCT Pub. Date: May 4, 2023

(65) Prior Publication Data
US 2025/0147111 A1 May 8, 2025

(30) Foreign Application Priority Data
Oct. 29, 2021 (CN) ......................... 202111279846.X

(51) Int. Cl.
*G01R 31/392* (2019.01)
*G01R 31/3835* (2019.01)
*H01M 10/54* (2006.01)

(52) U.S. Cl.
CPC ....... *G01R 31/392* (2019.01); *G01R 31/3835* (2019.01); *H01M 10/54* (2013.01)

(58) Field of Classification Search
CPC . H01M 10/54; G01R 31/3835; G01R 31/392; Y02E 60/10; Y02W 30/84
See application file for complete search history.

(56) References Cited

U.S. PATENT DOCUMENTS 9,791,514 B2 * 10/2017 Nishizawa .............. B60L 58/16
10,330,738 B2 * 6/2019 Kim ..................... G01R 31/367
10,879,569 B2 * 12/2020 Yeom ................. H01M 10/425

* cited by examiner

*Primary Examiner* — An H Do
(74) *Attorney, Agent, or Firm* — Westbridge IP LLC

(57) ABSTRACT

Disclosed is a method and device for screening an echelon-use battery. The method includes: collecting a first initial voltage and a first voltage change data of a standard battery of the same batch as a test battery; acquiring a first voltage difference data; acquiring an allowable echelon-use voltage difference range corresponding to the first initial voltage according to the first initial voltage, the first voltage difference data and an allowable echelon-use deviation; collecting a second initial voltage and a second voltage change of the test battery, acquiring a second voltage difference data, when the second initial voltage and the first initial voltage are the same, determining whether the second voltage difference data falls within the allowable echelon-use voltage difference range, the test battery is qualified if the second voltage difference data falls into the range.

16 Claims, 1 Drawing Sheet

SCREENING METHOD AND DEVICE FOR ECHELON-USE BATTERY

TECHNICAL FIELD

The present invention relates to the technical field of batteries, in particular to a screening method and device for echelon-use battery.

BACKGROUND

During recycling of waste batteries, a large number of recycled batteries are car batteries. When the effective capacity of car batteries decays by 80% or less, they are not suitable for continued use as power batteries and should be withdrawn from operation. However, this type of battery has relatively ideal remaining capacity which can be screened for reuse.

For an echelon use, it is necessary to conduct independent charging and discharging tests on the battery. According to the charging and discharging characteristics, the property and performance of the battery can be determined. Then the battery with qualified performance can be screened and used in other fields to achieve an echelon use. The echelon-use batteries need to be discharged, charged, and operated for multiple cycles to evaluate the health and residual value of the batteries. However, the current preliminary screening methods have a relatively low accuracy rate, and the entire charging and discharging process is required to be screened to obtain an accurate result, which is time consuming. Therefore, there is a need for a new screening method and device for echelon-use battery, which can improve the accuracy of screening and reduce the time for battery screening.

SUMMARY

The purpose of the present invention is to provide a new screening method and device for echelon-use battery, which can improve screening accuracy and reduce battery screening time.

In order to achieve the above objective, the present invention provides a screening method for echelon-use battery, including:

- collecting a first initial voltage data and a first voltage change data of a standard battery of the same batch as a test battery through a constant-voltage difference constant-current charging circuit; acquiring a first voltage difference data corresponding to the first initial voltage according to the first voltage change data; acquiring an allowable echelon-use voltage difference range corresponding to the first initial voltage according to the first initial voltage, the first voltage difference data, and an allowable echelon-use deviation; and
- collecting a second initial voltage data and a second voltage change data of the test battery through a constant-voltage difference constant-current charging circuit; acquiring a second voltage difference data according to the second voltage change data; determining whether the second voltage difference data falls within the allowable echelon-use voltage difference range, and qualifying the tested battery if the second voltage difference data falls within the allowable echelon-use voltage difference range.

Further, the first voltage difference data is obtained by:

- collecting a first voltage change data when the standard battery is charged at a predetermined sampling interval to obtain a first voltage data;
- acquiring an initial first voltage difference data according to the first voltage data, a voltage rating data, and a voltage difference parameter; the initial first voltage difference data includes voltage differences at several sampling intervals;
- taking the several sampling intervals as a standard sampling time, and averaging the voltage differences at the sampling intervals to obtain a voltage difference of the standard sampling time;
- acquiring the first voltage difference data composed of multiple voltage differences of the standard sampling time.

Further, the second voltage difference data is obtained by:

- collecting a second voltage change data when the test battery is charged at a predetermined sampling interval to obtain a second voltage data;
- acquiring an initial second voltage difference data according to the second voltage data, a voltage rating data, and a voltage difference parameter; the initial second voltage difference data includes voltage differences obtained at several sampling intervals;
- taking the several sampling intervals as a standard sampling time, and averaging the voltage differences at the sampling intervals to obtain a voltage difference of the standard sampling time; and
- acquiring the second voltage difference data composed of multiple voltage differences of the standard sampling time.

Further, the value of the voltage difference parameter is greater than zero and less than or equal to two.

Further, a constant current of the constant voltage difference constant current charging circuit does not exceed 900 mA.

The invention also discloses a screening device for an echelon-use battery, which includes: a constant-voltage difference constant-current charging circuit, a data acquisition and recording circuit, a data comparison unit and a CPU control unit; the CPU control unit is respectively associated with the data comparison unit, the data acquisition and recording circuit and the constant-voltage difference constant-current charging circuit; the data acquisition and recording circuit is connected to the constant-voltage difference constant-current charging current;

The constant-voltage difference constant-current charging circuit is connected to a standard battery or a test battery, and is used for charging the standard battery or the test battery;

The data acquisition and recording circuit is used to collect the first initial voltage and the first voltage change data of the standard battery and the second initial voltage and the second voltage change data of the test battery, which are fed back by the constant-voltage difference constant-current charging circuit, and the collected first initial voltage, second initial voltage, first voltage change data, and second voltage change data are sent to the CPU control unit for processing and storage;

The CPU control unit is used to convert the received first voltage change data into first voltage difference data, convert the first voltage difference data into an allowable echelon-use voltage difference range, and convert the second voltage change data into a second voltage difference range. The second voltage difference data, and the allowable echelon-use voltage difference range are sent to the data comparison unit for comparison;

The data comparison unit is used to compare whether the second voltage difference data falls within the allowable echelon-use voltage difference range, and if it falls, it is determined that the test battery is qualified.

Further, the first voltage difference data is obtained by:

collecting a first voltage change data when the standard battery is charged at a predetermined sampling interval to obtain a first voltage data;

acquiring an initial first voltage difference data according to the first voltage data, a voltage rating data, and a voltage difference parameter; the initial first voltage difference data includes voltage differences at several sampling intervals;

taking the several sampling intervals as a standard sampling time, and averaging the voltage differences at the sampling intervals to obtain a voltage difference of the standard sampling time;

acquiring the first voltage difference data composed of multiple voltage differences of the standard sampling time.

Further, the second voltage difference data is obtained by:

collecting a second voltage change data when the test battery is charged at a predetermined sampling interval to obtain a second voltage data;

acquiring an initial second voltage difference data according to the second voltage data, a voltage rating data, and a voltage difference parameter; the initial second voltage difference data includes voltage differences obtained at several sampling intervals;

taking the several sampling intervals as a standard sampling time, and averaging the voltage differences at the sampling intervals to obtain a voltage difference of the standard sampling time; and acquiring the second voltage difference data composed of multiple voltage differences of the standard sampling time.

Further, the screening device further includes a signal output unit connected to the CPU control unit, and the signal output unit is used to display a screening result of the battery.

Further, the constant current of the constant-voltage difference constant-current charging circuit does not exceed 900 mA.

Compared with the prior art, the method and device for screening echelon-use batteries according to the embodiment example of the present invention have a beneficial effect in that it uses the voltage difference data of the same batch of batteries and the allowable echelon-use deviation to formulate a battery screening standard. It is possible to eliminate the detection error caused by the battery itself, and achieve a more scientific screening standard for a test battery. The comparison between the second voltage data and the allowable echelon-use voltage difference range can quickly and more accurately determine whether a test battery meets an echelon-use standard, and save the screening time.

DETAILED DESCRIPTION OF ILLUSTRATED EXAMPLES

The specific implementation of the present invention will be described in further detail below in conjunction with the accompanying drawings and embodiment examples. The following embodiment examples are used to illustrate the present invention, but not to limit the scope of the present invention.

Embodiment Example 1

Figure 1:
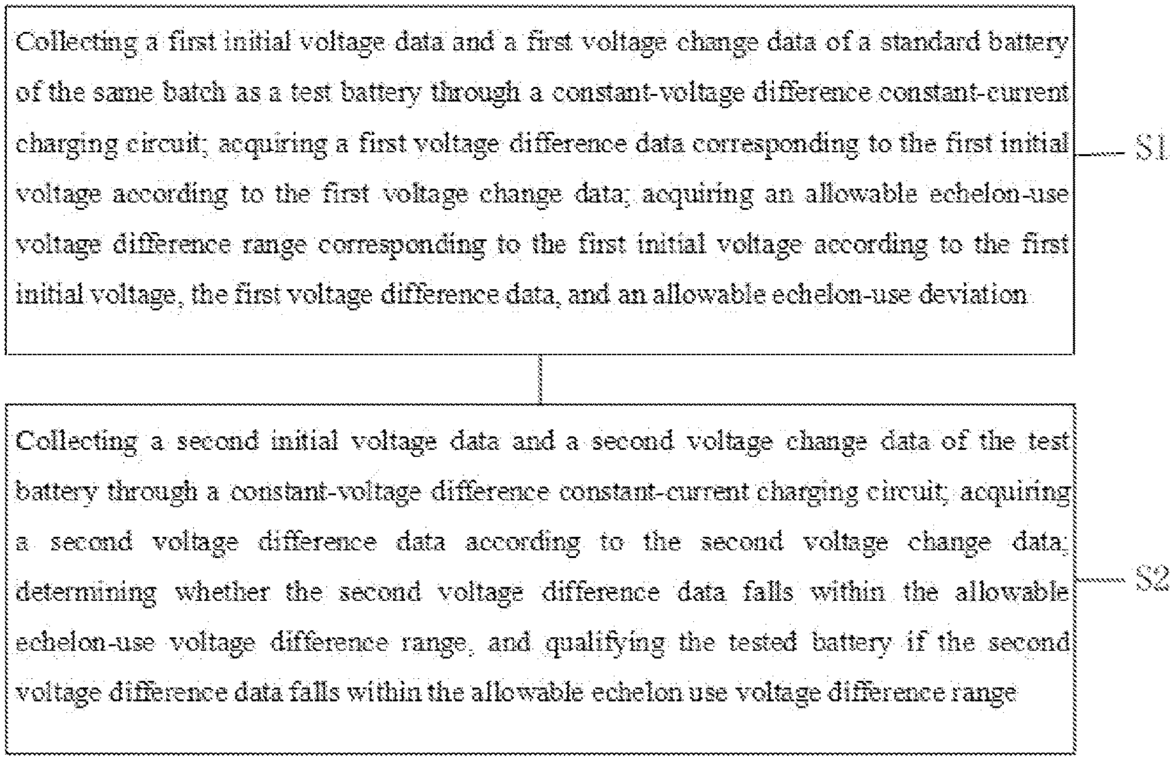
FIG. 1 is a schematic flow chart of a screening method for an echelon-use battery according to the present invention.

As shown in FIG. 1, the present invention discloses a method for screening an echelon-use battery, which is applied to the screening of recycled waste batteries for echelon-use and mainly includes the following steps:

Step S1: Collecting a first initial voltage and a first voltage change data of a standard battery of the same batch as a test battery through a constant-voltage difference constant-current charging circuit; acquiring a first voltage difference data corresponding to the first initial voltage according to the first voltage change data; according to the first initial voltage, the first voltage difference data, and an allowable echelon-use deviation, acquiring an allowable echelon-use voltage difference range corresponding to the first initial voltage.

Step S2: Collecting a second initial voltage and a second voltage change data of a test battery through the constant-voltage difference constant-current charging circuit, and acquiring a second voltage difference data according to the second voltage change data; when the second initial voltage is the same as the first initial voltage, determining whether the second voltage difference data falls within the allowable echelon-use voltage difference range, and qualifying the test battery if the second voltage difference data falls within the allowable echelon-use range.

In this embodiment example, for the recycled used batteries, an appearance screening is first performed. The batteries are distinguished according to information such as manufacturer and model, and evaluated for deformation or damage according to the appearance of the batteries. The deformed or damaged batteries are rejected. Only batteries passing the preliminary screening are subjected to echelon use.

In this embodiment example, since batteries of different capacities and models have different performance variation range, the deviation range of the standard data is appropriately adjusted according to different capacities, models, and batches of batteries. Generally, the greater the battery capacity, the greater the deviation range. Therefore, it is necessary to determine different standard data values after individual measurements on different batches of batteries. The standard data value is the allowable echelon-use voltage difference range.

Therefore, in step S1, it is first to decide the standard battery corresponding to the test battery, and then acquire the standard data value measured by the standard battery. Specifically, the first initial voltage and the first voltage change data of the standard battery of the same batch as the test battery are obtained through the constant-voltage difference constant-current charging circuit; the first voltage change data corresponding to the first initial voltage is acquired according to the first voltage change data; according to the first initial voltage, the first voltage difference data, and the allowable echelon-use deviation, the allowable echelon-use voltage difference range corresponding to the first initial voltage is obtained.

In this embodiment example, the two poles of an intact standard battery of the same batch are connected to the constant-voltage difference constant-current charging circuit for charging, and the data acquisition and recording circuit collects the initial voltage and voltage change data of the battery and stores it in a memory as a standard sampling value.

In this embodiment example, in order to improve the accuracy of the measurement result, multiple sets of data can be collected to conclude an average value. In this application, the CPU control unit includes a memory. Charging through the constant-voltage difference constant-current charging circuit can avoid an influence of voltage and current changes on battery charging, and improve the data accuracy. A curve composed of the first initial voltage and the first voltage change data after charging for a certain period.

In this embodiment example, the first voltage difference data is obtained by:

- collecting a first voltage change data when the standard battery is charged at a predetermined sampling interval to obtain a first voltage data;
- acquiring an initial first voltage difference data according to the first voltage data, a voltage rating data, and a voltage difference parameter; the initial first voltage difference data includes voltage differences at several sampling intervals;
- taking the several sampling intervals as a standard sampling time, and averaging the voltage differences at the sampling intervals to obtain a voltage difference of the standard sampling time; and
- acquiring the first voltage difference data composed of multiple voltage differences of the standard sampling time.

In this embodiment example, the sampling interval is usually set to 0.2 second, the sampling standard time is 1 second, and the voltage difference of each standard sampling time is collected and recorded. Those skilled in the art can set the sampling interval and standard sampling time as needed, such as the interval of 0.25 second, the interval of 0.1 second.

In this embodiment example, the initial first voltage difference data is obtained according to the first voltage data, a voltage rating data, and a voltage difference parameter, specifically:

Calculating the voltage difference according to the following formula: voltage difference=(battery rated voltage-battery actual voltage)×voltage difference parameter, the value range of the voltage difference parameter is greater than zero and less than or equal to 2, usually the voltage difference is 0.1-2V. The voltage difference at each sampling interval can be obtained according to the first voltage data change, and the voltage difference at these sampling intervals constitutes the first voltage data. The actual voltage of the battery is the voltage at the sampling interval. The above-mentioned operation is repeated for each sampling interval to obtain the first voltage difference data.

Since the first voltage difference data still has a certain error, it needs to be corrected. Specifically, the allowable echelon-use voltage difference range corresponding to the first initial voltage is obtained according to the first initial voltage, the first voltage difference data, and the allowable echelon-use deviation. The first voltage difference data is corrected by the allowable echelon-use deviation range to obtain the allowable echelon-use voltage difference range corresponding to the first initial voltage.

Store the obtained allowable echelon-use voltage difference range for subsequent comparison.

In this embodiment example, multiple standard batteries are usually measured to select a certain ratio of the batteries with the most stable performance for re-measurement and then average their data as the standard data.

When the charging data of the battery of the same batch as the test battery is acquired, the acquisition of the charging data of the test battery can be started.

In step S2, the second initial voltage and the second voltage change data of the test battery are collected through the constant-voltage difference constant-current charging circuit, and the second voltage difference data is obtained according to the second voltage change data. When the second initial voltage is the same as the first initial voltage, it is determined whether the second voltage difference data falls within the allowable echelon-use voltage difference range, and if the second voltage difference data falls within the allowable echelon-use range, the test battery is qualified.

In this embodiment example, the method for obtaining the second voltage difference data is the same as the method for obtaining the first voltage difference data, and the acquisition of the second voltage difference data can be accessed with reference to the description of the first voltage difference data in this application.

In this embodiment example, the second voltage difference data is obtained by:

- collecting a second voltage change data when the test battery is charged at a predetermined sampling interval to obtain a second voltage data;
- acquiring an initial second voltage difference data according to the second voltage data, a voltage rating data, and a voltage difference parameter; the initial second voltage difference data includes voltage differences obtained at several sampling intervals;
- taking the several sampling intervals as a standard sampling time, and averaging the voltage differences at the sampling intervals to obtain a voltage difference of the standard sampling time;
- acquiring the second voltage difference data composed of multiple voltage differences of the standard sampling time.

In this embodiment example, the sampling standard time for the second voltage difference data does not exceed ten minutes. By adopting the screening method of the present application, a high-precision screening result can be obtained by acquiring data for ten minutes, which can effectively reduce the screening time and improve the screening efficiency.

In this embodiment example, in order to improve the accuracy of battery screening, only when the second initial voltage and the first initial voltage are the same, it goes further to determine whether the second voltage difference data falls within the allowable echelon-use voltage difference range. Those skilled in the art can collect data according to the standard battery data collection method disclosed in this application through a limited number of experiments to achieve a database, which must have a data matching the second initial voltage. If a matching data cannot be found, it means that the initial voltage of the test battery has undergone a large deviation, and the battery does not satisfy a condition for echelon-use.

If the second voltage difference data falls within the allowable echelon-use range, it is determined that the battery to be tested is qualified. If it does not fall into the echelon-use range, the battery to be tested is determined to be unqualified.

In this embodiment example, the value of the voltage difference parameter is greater than zero and less than or equal to two.

In this embodiment example, the constant-voltage difference constant-current charging circuit is an existing technology. An optional implementation of the charging circuit is performing voltage and current control to a Texas Instruments LM3420-4.2 chip charging circuit. The constant current of the constant-voltage difference constant-current charging circuit does not exceed 900 mA. When the constant current of the constant-voltage difference constant-current charging current does not exceed a certain range, the measurement error of the circuit is smaller.

Embodiment Example 2

Figure 2:
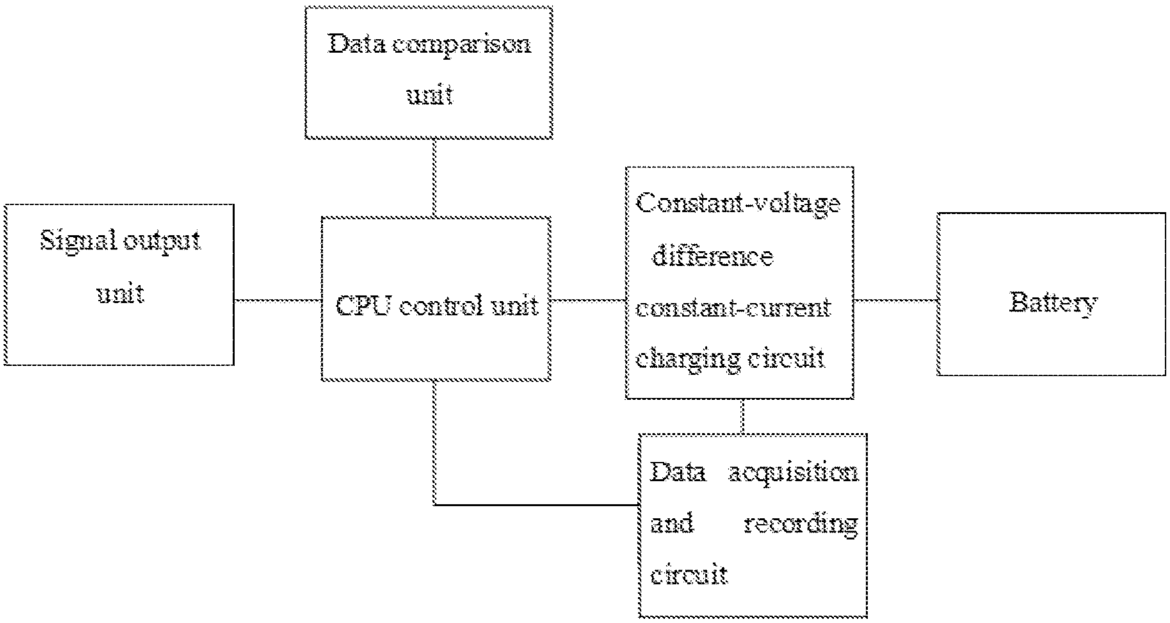
FIG. 2 is a schematic structural diagram of a screening device for an echelon-use battery of the present invention.

On the basis of Embodiment Example 1, referring to FIG. 2, the present invention also discloses an echelon-use battery screening device, which is applied to the screening of recycled waste batteries for echelon-use, including: a constant-voltage difference constant-current charging circuit, a data acquisition and recording circuit, a data comparison unit and a CPU control unit; the CPU control unit is respectively associated with the data comparison unit, the data acquisition and recording circuit and the constant-voltage difference constant-current charging circuit; the data acquisition and recording circuit is current connected to the constant-voltage difference constant-current charging circuit.

The constant-voltage difference constant-current charging circuit is connected to a standard battery or a test battery, and is used for charging the standard battery or the test battery.

The data acquisition and recording circuit is used to collect the first initial voltage and first voltage change data of the standard battery and the second initial voltage and second voltage change data of the test battery, all of which are fed back by the constant-voltage difference constant-current charging circuit. The collected first initial voltage, second initial voltage, first voltage change data, and second voltage change data are sent to the CPU control unit for processing and storage.

The CPU control unit is used to convert the received first voltage change data into first voltage difference data, convert the first voltage difference data into an allowable echelon-use voltage difference range, and convert the second voltage change data into a second voltage difference range. The second voltage difference data and the allowable echelon-use voltage difference range are sent to the data comparison unit for comparison.

The data comparison unit is used to compare and determine whether the second voltage difference data falls within the allowable echelon-use voltage difference range. The test battery is qualified, when the second voltage difference data falls within the allowable echelon-use voltage difference range.

The screening device of the present application applies the screening method of Embodiment Example 1 to screen batteries. The first initial voltage and first voltage change data of the standard battery of the same batch as the test battery are collected through the constant-voltage difference constant-current charging circuit; the first voltage difference corresponding to the first initial voltage is acquired according to the first voltage change data; according to the first initial voltage, the first voltage difference data and the allowable echelon-use deviation, the allowable echelon-use voltage difference range corresponding to the first initial voltage is obtained; and the second initial voltage and the second voltage change data of the test battery is obtained through the constant-voltage difference constant-current charging circuit, the second voltage difference data is obtained according to the second voltage change data. When the second initial voltage and the first initial voltage are the same, it is determined whether the second voltage difference data falls into the allowable echelon-use voltage difference range. If the second voltage difference data falls within the allowable echelon-use range, it is determined that the test battery is qualified.

In this embodiment example, the first voltage difference data is specifically:

Collecting the first voltage change data when the standard battery is charged according to a predetermined sampling interval to obtain the first voltage data;

Acquiring the initial first voltage difference data according to the first voltage data, the voltage rating data, and the voltage difference parameter; the initial first voltage difference data includes voltage differences at multiple sampling intervals;

Several sampling intervals constitute a sampling standard time, and the average value of the voltage difference of multiple sampling intervals within the sampling standard time is taken as the voltage difference of the sampling standard time;

The voltage difference of a plurality of sampling standard times composes the first voltage difference data.

In this embodiment example, the second voltage difference data is specifically:

collecting a second voltage change data when the test battery is charged at a predetermined sampling interval to obtain a second voltage data;

acquiring an initial second voltage difference data according to the second voltage data, a voltage rating data, and a voltage difference parameter; the initial second voltage difference data includes voltage differences obtained at several sampling intervals;

taking the several sampling intervals as a standard sampling time, and averaging the voltage differences at the sampling intervals to obtain a voltage difference of the standard sampling time; and acquiring the second voltage difference data composed of multiple voltage differences of the standard sampling time.

In this embodiment example, the time for collecting the second voltage difference data does not exceed ten minutes. By adopting the screening method of the present application, a high-precision screening result can be obtained by collecting data for ten minutes, which can effectively reduce the screening time and improve the screening efficiency.

In this embodiment example, the screening device further includes a signal output unit connected to the CPU control unit, and the signal output unit is used to display the screening result of the battery.

In this embodiment example, the constant current of the constant-voltage difference constant-current charging circuit does not exceed 900 mA. When the constant current is in a certain range, the measurement error of the circuit is smaller.

Since the screening device of Embodiment Example 2 adopts the screening method of Embodiment Example 1, those skilled in the art know that the technical features in Embodiment Example 1 can be directly applied to Embodiment Example 2. Those skilled in the art can understand the description of the first voltage difference data and the second voltage difference data in the second embodiment example under Embodiment Example 1.

To sum up, compared with the prior art, the screening method and device for echelon-use batteries in the embodiment example of the present invention has a beneficial effect in that it is based on the voltage difference data of the batteries of the same batch and take an allowable echelon-use deviation range to as a battery screening standard, which can eliminate a detection error caused by the battery itself to the largest extent, and get a more scientific screening standard for the test battery. The comparison between the second voltage difference data and the allowable echelon-use voltage difference range can quickly and more accurately determine whether the test battery meets the difference standard, and save the screening time.

The above are only the preferred embodiment examples of the present invention. It should be pointed out that for those of ordinary skill in the art, without departing from the technical principles of the present invention, several improvements and substitutions can be made. These improvements and substitutions should also be regarded as fall in the protection scope of the present invention.

The invention claimed is:

1. A screening method for an echelon-use battery, the screening method being performed by a screening device comprising a constant-voltage difference constant-current charging circuit, a data acquisition and recording circuit, a data comparison unit, and a CPU control unit, wherein the CPU control unit is respectively connected to the data comparison unit, the data acquisition and recording circuit, and the constant-voltage difference constant-current charging circuit, and the data acquisition and recording circuit is connected to the constant-voltage difference constant-current charging circuit, the screening method comprising:

connecting a standard battery of a same batch as a test battery to the constant-voltage difference constant-current charging circuit and charging the standard battery by the constant-voltage difference constant-current charging circuit;

collecting, by the data acquisition and recording circuit during the charging of the standard battery, first initial voltage data and first voltage change data of the standard battery of the same batch as the test battery fed back by the constant-voltage difference constant-current charging circuit, and transmitting the collected first initial voltage data and first voltage change data to the CPU control unit;

acquiring, by the CPU control unit, first voltage difference data corresponding to the first initial voltage data according to the first voltage change data;

acquiring, by the CPU control unit, an allowable echelon-use voltage difference range corresponding to the first initial voltage data according to the first initial voltage data, the first voltage difference data, and an allowable echelon-use deviation;

connecting the test battery to the constant-voltage difference constant-current charging circuit and charging the test battery by the constant-voltage difference constant-current charging circuit;

collecting, by the data acquisition and recording circuit during the charging of the test battery, second initial voltage data and second voltage change data of the test battery fed back by the constant-voltage difference constant-current charging circuit, and transmitting the collected second initial voltage data and second voltage change data to the CPU control unit;

acquiring, by the CPU control unit, second voltage difference data according to the second voltage change data;

transmitting, by the CPU control unit, the second voltage difference data and the allowable echelon-use voltage difference range to the data comparison unit; and determining, by the data comparison unit, whether the second voltage difference data falls within the allowable echelon-use voltage difference range, and qualifying the test battery if the second voltage difference data falls within the allowable echelon-use voltage difference range.

2. A screening method for an echelon-use battery according to claim 1, wherein the first voltage difference data is obtained by:

collecting, by the data acquisition and recording circuit, the first voltage change data at predetermined sampling intervals while the standard battery is being charged by the constant-voltage difference constant-current charging circuit, thereby obtaining first voltage data;

acquiring, by the CPU control unit, initial first voltage difference data according to the first voltage data, rated voltage data, and a voltage difference parameter; the initial first voltage difference data includes voltage differences at a plurality of sampling intervals;

grouping, by the CPU control unit, the plurality of sampling intervals into a plurality of standard sampling periods;

averaging, by the CPU control unit, the voltage differences at the plurality of sampling intervals within each standard sampling period to obtain a voltage difference for each standard sampling period; and acquiring, by the CPU control unit, the first voltage difference data comprising the voltage differences for the plurality of standard sampling periods.

3. A screening method for an echelon-use battery according to claim 2, wherein the voltage difference parameter is greater than 0 and less than or equal to 2.

4. A screening method for an echelon-use battery according to claim 2, wherein a constant current of the constant-voltage difference constant-current charging circuit does not exceed 900 mA.

5. A screening method for an echelon-use battery according to claim 1, wherein the second voltage difference data is obtained by:

collecting, by the data acquisition and recording circuit, the second voltage change data at predetermined sampling intervals while the test battery is being charged by the constant-voltage difference constant-current charging circuit, thereby obtaining second voltage data;

acquiring, by the CPU control unit, initial second voltage difference data according to the second voltage data, rated voltage data, and a voltage difference parameter, wherein the initial second voltage difference data includes voltage differences at a plurality of sampling intervals;

grouping, by the CPU control unit, the plurality of sampling intervals into a plurality of standard sampling periods;

averaging, by the CPU control unit, the voltage differences at the plurality of sampling intervals within each standard sampling period to obtain a voltage difference for each standard sampling period; and acquiring, by the CPU control unit, the second voltage difference data comprising the voltage differences for the plurality of standard sampling periods.

6. A screening method for an echelon-use battery according to claim 5, wherein the voltage difference parameter is greater than 0 and less than or equal to 2.

7. A screening method for an echelon-use battery according to claim 5, wherein a constant current of the constant-voltage difference constant-current charging circuit does not exceed 900 mA.

8. A screening method for an echelon-use battery according to claim 1, wherein a constant current of the constant-voltage difference constant-current charging circuit does not exceed 900 mA.

9. A screening device for an echelon-use battery, comprising a constant-voltage difference constant-current charging circuit, a data acquisition and recording circuit, a data comparison unit and a CPU control unit; the CPU control unit is respectively connected to the data comparison unit, the data acquisition and recording circuit and the constant-voltage difference constant-current charging circuit; the data acquisition and recording circuit is connected to the constant-voltage difference constant-current charging circuit;

the constant-voltage difference constant-current charging circuit is connected to a standard battery or a test battery, and is used for charging the standard battery or the test battery;

the data acquisition and recording circuit is used to collect first initial voltage data and a first voltage change data of a standard battery and a second initial voltage data and a second voltage change data of a test battery, which are fed back by the constant-voltage difference constant-current charging circuit, and the collected first initial voltage data, second initial voltage data, first voltage change data, and second voltage change data are sent to the CPU control unit for processing and storage;

the CPU control unit is used to convert the received first voltage change data into first voltage difference data, convert the first voltage difference data into an allowable echelon-use voltage difference range, and convert the second voltage change data into a second voltage difference data; the second voltage difference data and the allowable echelon-use voltage difference range are sent to the data comparison unit for comparison; and the data comparison unit is used to determine whether the second voltage difference data falls within the allowable echelon-use voltage difference range, and if it falls in the range, it is determined that the test battery is qualified.

10. A screening device for an echelon-use battery according to claim 9, wherein the first voltage difference data is obtained specifically by:

collecting, by the data acquisition and recording circuit, the first voltage change data at predetermined sampling intervals while the standard battery is being charged by the constant-voltage difference constant-current charging circuit, thereby obtaining first voltage data;

acquiring, by the CPU control unit, initial first voltage difference data according to the first voltage data, rated voltage data, and a voltage difference parameter, wherein the initial first voltage difference data includes voltage differences at a plurality of sampling intervals;

grouping, by the CPU control unit, the plurality of sampling intervals into a plurality of standard sampling periods;

averaging, by the CPU control unit, the voltage differences at the plurality of sampling intervals within each standard sampling period to obtain a voltage difference for each standard sampling period; and acquiring, by the CPU control unit, the first voltage difference data comprising the voltage differences for the plurality of standard sampling periods.

11. A screening device for an echelon-use battery according to claim 10, wherein the constant current of the constant-voltage difference constant-current charging circuit does not exceed 900 mA.

12. A screening device for an echelon-use battery according to claim 9, wherein the second voltage difference data is obtained by:

collecting, by the data acquisition and recording circuit, the second voltage change data at predetermined sampling intervals while the test battery is being charged by the constant-voltage difference constant-current charging circuit, thereby obtaining second voltage data;

acquiring, by the CPU control unit, initial second voltage difference data according to the second voltage data, rated voltage data, and a voltage difference parameter, wherein the initial second voltage difference data includes voltage differences at a plurality of sampling intervals;

grouping, by the CPU control unit, the plurality of sampling intervals into a plurality of standard sampling periods;

averaging, by the CPU control unit, the voltage differences at the plurality of sampling intervals within each standard sampling period to obtain a voltage difference for each standard sampling period; and acquiring, by the CPU control unit, the second voltage difference data comprising the voltage differences for the plurality of standard sampling periods.

13. A screening device for an echelon-use battery according to claim 12, wherein the constant current of the constant-voltage difference constant-current charging circuit does not exceed 900 mA.

14. A screening device for an echelon-use battery according to claim 9, wherein the screening device further comprises a signal output unit connected to the CPU control unit, and the signal output unit is used to display a screening result of the battery.

15. A screening device for an echelon-use battery according to claim 14, wherein the constant current of the constant-voltage difference constant-current charging circuit does not exceed 900 mA.

16. A screening device for an echelon-use battery according to claim 9, wherein the constant current of the constant-voltage difference constant-current charging circuit does not exceed 900 mA.

* * * * *